(12) United States Patent
Jin et al.

(10) Patent No.: US 7,779,897 B2
(45) Date of Patent: Aug. 24, 2010

(54) HEAT DISSIPATION DEVICE WITH HEAT PIPES

(75) Inventors: Zhao Jin, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology, Co., Ltd., Tu-Cheng, Taipei Hsien (TW)

( * ) Notice: Subject to any disclaimer, the term of this patent is extended or adjusted under 35 U.S.C. 154(b) by 479 days.

(21) Appl. No.: 11/772,810

(22) Filed: Jul. 2, 2007

(65) Prior Publication Data
US 2009/0008065 A1 Jan. 8, 2009

(51) Int. Cl.
*F28D 15/00* (2006.01)
*F28F 7/00* (2006.01)
*H05K 7/20* (2006.01)

(52) U.S. Cl. .................. 165/104.33; 165/80.3; 361/700

(58) Field of Classification Search ............ 165/104.33; 361/700
See application file for complete search history.

(56) References Cited

U.S. PATENT DOCUMENTS

| | | | | |
|---|---|---|---|---|
| 5,896,922 A | * | 4/1999 | Chrysler et al. | 165/165 |
| 6,717,813 B1 | * | 4/2004 | Garner | 361/700 |
| 7,100,681 B1 | * | 9/2006 | Wu et al. | 165/104.33 |
| 7,278,470 B2 | * | 10/2007 | Xia et al. | 165/104.33 |
| 7,609,521 B2 | * | 10/2009 | Wu | 361/700 |
| 7,679,912 B1 | * | 3/2010 | Xiong et al. | 361/700 |
| 7,694,727 B2 | * | 4/2010 | Yang et al. | 165/104.33 |
| 7,698,815 B2 | * | 4/2010 | Garner | 29/890.04 |
| 2006/0054307 A1 | * | 3/2006 | Lee et al. | 165/80.3 |
| 2006/0104032 A1 | * | 5/2006 | Lee et al. | 361/700 |
| 2006/0203451 A1 | * | 9/2006 | Wei et al. | 361/700 |
| 2007/0006997 A1 | * | 1/2007 | Hsieh | 165/104.33 |
| 2007/0074857 A1 | | 4/2007 | Xia et al. | |
| 2007/0215321 A1 | * | 9/2007 | Yang et al. | 165/80.3 |
| 2008/0093052 A1 | * | 4/2008 | Yang et al. | 165/80.3 |
| 2009/0107653 A1 | * | 4/2009 | Jiang et al. | 165/80.3 |

FOREIGN PATENT DOCUMENTS

TW M267830 6/2005
TW 200633628 A 9/2006

\* cited by examiner

*Primary Examiner*—Cheryl J Tyler
*Assistant Examiner*—Brandon M Rosati
(74) *Attorney, Agent, or Firm*—Jeffrey T. Knapp

(57) ABSTRACT

A heat dissipation device for dissipating heat from a heat-generating device includes a heat-absorbing plate, a heat pipe assembly attached to the heat-absorbing plate and a fin set attached to the heat pipe assembly. The fin set includes a plurality of fins and has a contacting surface cooperatively formed by bottom edges of the fins and attached to the heat pipe assembly. The heat pipe assembly includes heat pipes with evaporating sections and condensing sections located away from the evaporating sections. The evaporating sections of the heat pipes are covered by the heat-absorbing plate and the condensing sections of the heat pipes are exposed outside of the heat-absorbing plate. The heat pipes absorb heat from the heat-generating device via the heat-absorbing plate, and directly transfer the heat to the fin set.

16 Claims, 2 Drawing Sheets

HEAT DISSIPATION DEVICE WITH HEAT PIPES

BACKGROUND OF THE INVENTION

1. Field of the Invention

The present invention generally relates to heat dissipation devices, and more particularly to a heat dissipation device having heat pipes for cooling an electronic device, such as an integrated circuit package.

2. Description of Related Art

Electronic components, such as central processing units (CPUs) comprise numerous circuits operating at high speed and generating a mass of heat that can be deleterious to their operation. Under most circumstances, it is necessary to cool the CPUs in order to maintain safe operating conditions and assure that the CPUs function properly and reliably. In the past, various approaches have been used to cool electronic components. Typically, a finned metal heat sink can be attached to an outer surface of the CPU to remove heat therefrom. The heat absorbed by the heat sink is then dissipated to ambient air. The related finned metal heat sink is made of highly heat-conductive metal, such as copper or aluminum, and generally comprises a solid metal base for contacting with the CPU to absorb the heat therefrom and a plurality of fins formed on the base for dissipating the heat. However, as the operating speed of electronic components has increased markedly in recent years, heat sinks that dissipate the heat only by metal conduction are insufficient and as a result, heat accumulated in a bottom of the metal heat sink cannot be transferred symmetrically to the whole heat dissipation device quickly enough.

Heat pipes, which operate by phase change of working liquid sealed in a hollow pipe, have been widely used due to their excellent heat transfer properties. Typically, a heat dissipation device has a base plate, a plurality of fins arranged vertically on a top face of the base plate, a plurality of heat pipes attached to a bottom face of the base plate and a heat-absorbing plate attached to a bottom face defined cooperatively by the heat pipes. The base plate defines a plurality of grooves receiving the heat pipes therein. In use, the heat-absorbing plate firstly absorbs heat from the electronic device and then transmits the heat to the heat pipes. The heat pipes transfer the heat to all parts of the base. The heat evenly distributed to the base is transmitted to the fins and is then dissipated to ambient air. However, the heat from the electronic device firstly transfers to the base by the heat pipes and then to the fins by the base. It fails to directly transfer the heat from the electronic device to the fins by the heat pipes. Thus, the heat dissipation efficiency is not high. In addition, the existence of the base plate increases cost and weight of the whole heat dissipation device.

Accordingly, what is needed is a heat dissipation device with heat pipes which has an enhanced heat dissipation performance and is inexpensive.

SUMMARY OF THE INVENTION

A heat dissipation device adapted for dissipating heat from a heat-generating device, includes a heat-absorbing plate, a heat pipe assembly attached to the heat-absorbing plate and a fin set attached to the heat pipe assembly. The fin set includes a plurality of fins and has a contacting surface cooperatively formed by bottom edges of the fins and attached to the heat pipe assembly. The heat pipe assembly includes at least a heat pipe with an evaporating section and a condensing section located away from the evaporating section. The evaporating section of the at least a heat pipe is covered by the heat-absorbing plate and the condensing section of the at least a heat pipe is exposed outside of the heat-absorbing plate. The evaporating section of the at least a heat pipe absorbs the heat from the heat-generating device via the heat-absorbing plate and directly transfers the heat to the fins of the fin set. The fins dissipate the heat to ambient air.

Other advantages and novel features will become more apparent from the following detailed description of preferred embodiment when taken in conjunction with the accompanying drawings, in which:

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
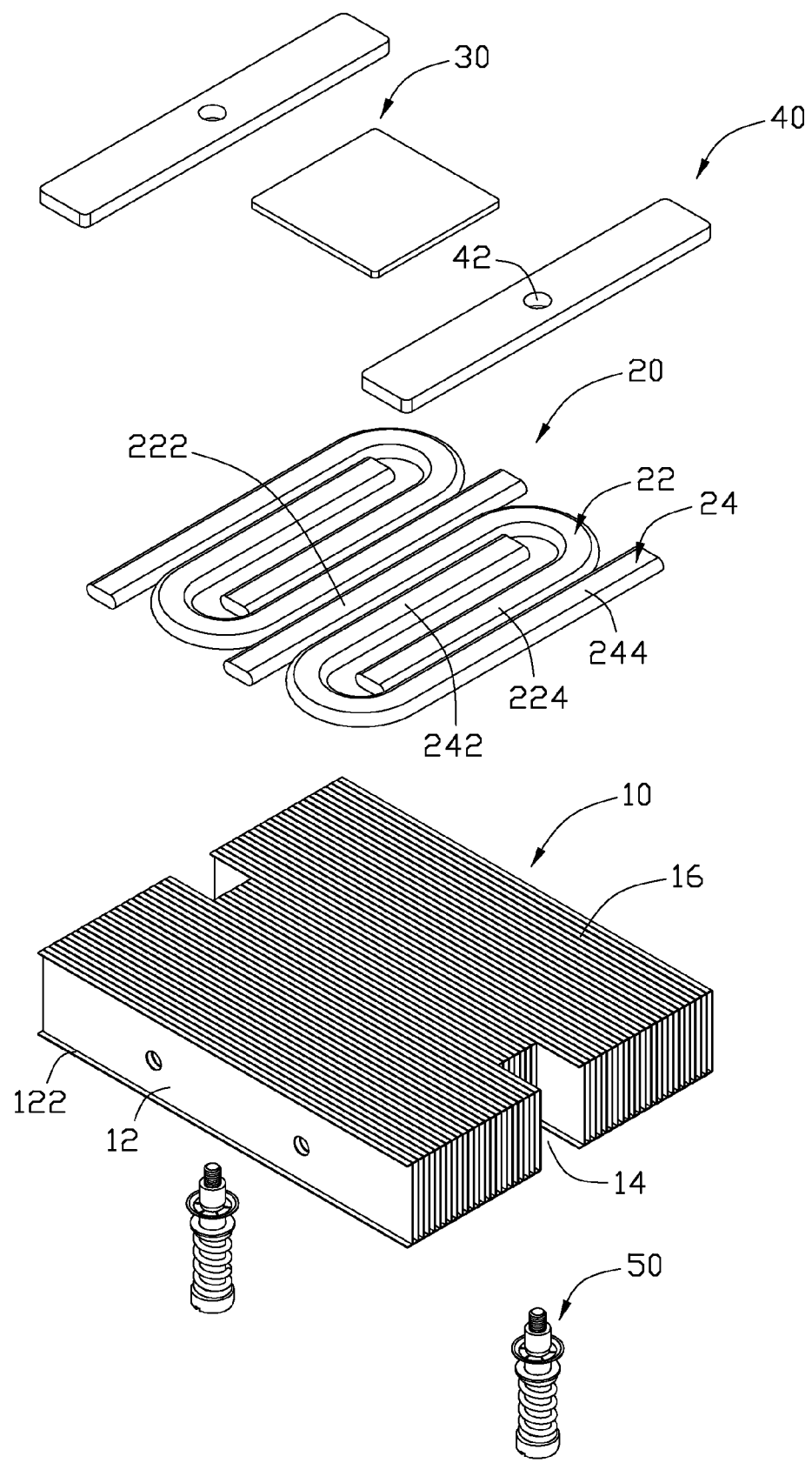
FIG. 1 is an exploded, isometric view of a heat dissipation device in accordance with a preferred embodiment of the present invention, as viewed from a bottom aspect.
Figure 2:
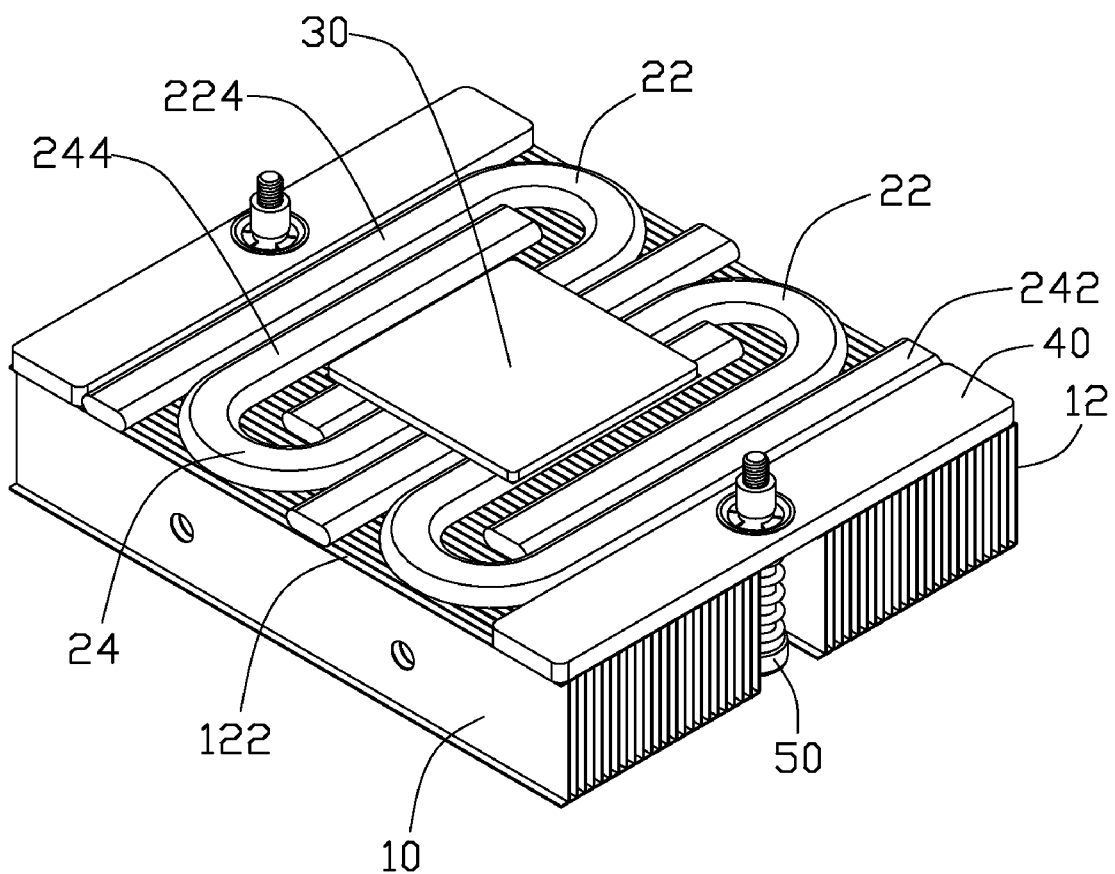
FIG. 2 is an assembled view of FIG. 1.

Referring to FIGS. 1-2, a heat dissipation device in accordance with a first embodiment of the present invention is shown. The heat dissipation device can be mounted to a printed circuit board (not shown) to remove heat from a heat-generating electronic device, such as a CPU (not shown) mounted on the printed circuit board. The heat dissipation device comprises a fin set 10, a heat pipe assembly 20 attached to a bottom surface of the fin set 10 and a heat-absorbing plate 30 contacting with a bottom surface of the heat pipe assembly 20. The heat-absorbing plate 30 has a bottom face for contacting with the CPU. The heat dissipation device further comprises a pair of positioning components (not labeled) attached to the fin set 10 for securing the heat dissipation device to the printed circuit board, whereby the bottom face of the heat-absorbing plate 30 can have an intimate contact with the CPU. The pair of positioning components comprises a pair of positioning plates 40 and a pair of screws 50.

The fin set 10 is substantially rectangular-shaped with two opposite long sides and two opposite short sides and comprises a plurality of spaced and parallel fins 12. Each fin 12 is made by a rectangular, thin metal sheet. A pair of flanges 122 extend perpendicularly from upper and lower side edges of each fin 12. In the fin set 10, the flanges 122 of a rear one of the fins 12 abut the flanges 122 of a front one of the fins 12. The flanges 122 of all the fins 12 are formed so as to be coplanar with each other to cooperatively form a flat contacting surface 16 at the bottom surface of the fin set 10. The heat pipe assembly 20 is soldered to the contacting surface 16, so that the flanges 122 thermally engage with the heat pipe assembly 20. The fin set 10 further defines two opposite depressions 14 each recessing in a middle portion of each of the two opposite short sides thereof.

The heat pipe assembly 20 comprises two pairs of U-shaped heat pipes abutting each other. Each pair of heat pipes comprises first and second heat pipes 22, 24. Each of the first and second heat pipes 22, 24 is elliptical-shaped in cross section and has a relatively planar bottom surface (not labeled) facing toward the heat-absorbing plate 30, and an planar top surface (not labeled) facing toward the contacting surface 16 of the fin set 10. The first heat pipe 22 comprises an evaporating section 222 and a condensing section 224 extending from an end of the evaporating section 222 and parallel to the evaporating section 222. The second heat pipe 24 comprises an evaporating section 242 and a condensing section 244 extending from an end of the evaporating section 242 and parallel to the evaporating section 242.

Each of the positioning plates 40 is a rectangular metal plate having good heat conductivity. The two positioning plates 40 each define a through hole 42 in a middle thereof, corresponding to one of the depressions 14 of the fin set 10. The screws 50 are received in the depressions 14 and extend through the holes 42 for attaching the heat dissipation device to the printed circuit board by threadedly engaging with a fixture (not shown) located beneath the printed circuit board.

In assembly of the heat dissipation device as shown in FIG. 2, the heat pipe assembly 20 is fixed on the contacting surface 16 of the fin set 10 by soldering or adhesive. The first and second heat pipes 22, 24 are juxtaposed to each other with the evaporating sections 222, 242 of the first and second heat pipes 22, 24 abutting against each other and located in the center portion of the bottom surface of the fin set 10. The heat-absorbing plate 30 is attached to the bottom surface of the heat assembly 20 at the evaporating sections 222, 242. The condensing sections 224, 244 of the first and second heat pipes 22, 24 are located away from the center portion of the bottom surface of the fin set 10 and away from the heat-absorbing plate 30. The first and second heat pipes 22, 24 of each pair are oriented in directions opposite to each other. The heat-absorbing plate 30 are fixed on the evaporating sections 222, 242 of the first and second heat pipes 22, 24 by soldering, with the condensing sections 224, 244 of the first and second heat pipes 22, 24 being exposed outside of the heat-absorbing plate 30. The positioning plates 40 are fixed at the two opposite short sides of the bottom surface of the fin set 10 by soldering. Bottom surfaces of the positioning plates 40 are essentially coplanar with the bottom surface of the heat-absorbing plate 30. The positioning plates 40 are located adjacent to the corresponding condensing sections 224, 244 of the first and second heat pipes 22, 24, respectively, so that the heat pipe assembly 20 is sandwiched between the two positioning plates 40. The screws 50 are received in the depressions 14 of the fin set 10 and extend in the through holes 42 of the positioning plates 40, for extending holes defined in the printed circuit board to fasten with the fixture (not shown) beneath the printed circuit board.

In use, the bottom surface of the heat-absorbing plate 30 of the heat dissipation device thermally contacts the CPU and absorbs the heat from the CPU. The evaporating sections 222, 242 of the heat pipe assembly 20 absorb the heat in the heat-absorbing plate 30 and directly transfer the heat to the fins 12 of the fin set 10 to be dissipated to ambient air.

According to the aforementioned description of the invention, in use of the heat dissipation device, the plurality of bent heat pipes 22, 24 are intimately juxtaposed with each other at the bottom surface of the fin set 10. Top surfaces of the heat pipes 22, 24 are coupled thermally to the contacting surface 16 of the fin set 10. Bottom surfaces of the heat pipes 22, 24 are flattened and level with each other so that they can thermally connect with the heat-absorbing plate 30. The heat pipes 22, 24 absorb heat from the CPU via the heat-absorbing plate 30, and then directly transfer the heat to the fin set 10, whereby the heat can be dissipated into ambient air. In comparison with the related art, the heat dissipation device of the present invention does not have the base of the related art located between the heat pipes and the fins; the heat absorbed by the heat pipes 22, 24 of the present invention is directly transferred to the fins 12 of the fin set 10; accordingly, the present invention can increase the heat-transferring speed from the heat-absorbing plate 30 to the fins 12; heat dissipation capacity of the heat dissipation device of the present invention is improved greatly.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat from a heat-generating device, comprising:
    a heat-absorbing plate for absorbing heat from the heat-generating device;
    a U-shaped heat pipe assembly thermally attached on the heat-absorbing plate, the U-shaped heat pipe assembly comprising a plurality of bent heat pipes each having an evaporating section and a condensing section extending from an end of the evaporating section; and
    a fin set thermally defining a contacting surface attached to the heat pipe assembly;
    wherein the evaporating sections of the U-shaped heat pipe assembly are covered by the heat-absorbing plate and the condensing sections of the U-shaped heat pipe assembly are exposed outside of the heat-absorbing plate the U-shaped heat pipe assembly and the heat absorbing plate, each being arranged on a same plane parallel to each other, and wherein the evaporating sections of the heat pipe directly contact the heat-absorbing plate, whereby the heat absorbed by the heat pipes from the heat-absorbing plate is directly transferred to the fin set.

2. The heat dissipation device as described in claim 1, wherein each heat pipe comprises a top flat surface directly contacting the contacting surface of the fin set and a bottom flat surface directly contacting the heat-absorbing plate.

3. The heat dissipation device as described in claim 2, further comprising a pair of positioning plates attached to opposite ends of the contacting surface of the fin set.

4. The heat dissipation device as described in claim 3, wherein the positioning plates are located adjacent to corresponding condensing sections of the heat pipe assembly.

5. The heat dissipation device as described in claim 4, wherein the evaporating sections of the heat pipes are located at a center portion of the contacting surface of the fin set and abut each other.

6. The heat dissipation device as described in claim 5, wherein the fin set defines two opposite depressions recessing from the two opposite ends of the fin set, screws being received in the depressions and engaged with the positioning plates to mount the heat dissipation device to the heat-generating device.

7. The heat dissipation device as described in claim 6, wherein the heat pipe assembly comprises at least two pairs of heat pipes arranged on the contacting surface of the fin set symmetrically relative to a middle line of the fin set.

8. The heat dissipation device as described in claim 7, wherein each pair of the at least two pairs of heat pipes are oriented opposite to each other and the condensing sections of the each pair of the at least two pairs of heat pipes abut against each other and are located adjacent to one of the opposite ends of the contacting surface of the fin set.

9. A heat dissipation device comprising:

a fin set having a plurality of fins with bottom edges cooperatively forming a contacting surface at a bottom surface of the fin set;

U-shaped heat pipe assembly thermally attached to the contacting surface of the fin set, the U-shaped heat pipe assembly having a top surface thermally attached on the contacting surface of the fin set and a bottom surface; and a heat-absorbing plate for absorbing heat from a heat-generating device, the heat-absorbing plate having a first face directly attached to the bottom surface of the at least a heat pipe and a second face for thermally engaging with the heat-generating device;

wherein the heat-absorbing plate covers an evaporating section of the U-shaped heat pipe assembly and has an area smaller than that of the contacting surface of the fin set the U-shaped heat pipe assembly and the heat absorbing plate, each being arranged on a same plane parallel to each other.

10. The heat dissipation device as described in claim 9, wherein the at least a heat pipe comprises a plurality of heat pipes juxtaposed with each other, the bottom surfaces of the heat pipes being coplanar to each other to form a face for contacting the heat-absorbing plate.

11. The heat dissipation device as described in claim 10, wherein the evaporating sections of the heat pipes are located in a center portion of the fin set and abut each other.

12. The heat dissipation device as described in claim 10, wherein the condensing sections of the heat pipes are located at opposite ends of the fin set.

13. A heat dissipation device comprising:

a fin set having a plurality of fins, the fins each having a flange extending perpendicularly from an edge thereof, the flanges cooperatively forming a contacting surface;

a plurality of U-shaped heat pipes thermally attached to the contacting surface of the fin set, the U-shaped heat pipes each having a top surface directly engaging with the contacting surface of the fin set and a bottom surface; and a heat-absorbing plate for absorbing heat from a heat-generating device, the heat-absorbing plate having a first face directly engaging with the bottom surfaces of the U-shaped heat pipes and a second face for thermally engaging with the heat-generating device, wherein the heat-absorbing plate only covers an evaporating section of each of the U-shaped heat pipes, the U-shaped heat pipes and the heat absorbing plate, each being arranged on a same plane parallel to each other.

14. The heat dissipation device as described in claim 13, wherein the heat-absorbing plate has an area smaller than that of the contacting surface of the fin set.

15. The heat dissipation device as described in claim 14, wherein the heat pipes comprise a plurality of pairs of U-shaped heat pipes, each pair of U-shaped heat pipes are oriented opposite to each other, and the evaporator sections of the U-shaped heat pipes are located adjacent to and abut against each other.

16. The heat dissipation device as described in claim 15, wherein condensing sections of the U-shaped heat pipes are horizontally located on the contacting surface of the fin set and exposed out of the heat-absorbing plate.

\* \* \* \* \*